(12) United States Patent
Kim (10) Patent No.: US 10,509,594 B2
(45) Date of Patent: Dec. 17, 2019

(54) MEMORY MODULE AND MEMORY SYSTEM INCLUDING THE SAME

(71) Applicant: SK hynix Inc., Gyeonggi-do (KR)

(72) Inventor: Kwan-Dong Kim, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 86 days.

(21) Appl. No.: 15/831,024

(22) Filed: Dec. 4, 2017

(65) Prior Publication Data
US 2018/0335979 A1    Nov. 22, 2018

(30) Foreign Application Priority Data

May 22, 2017    (KR) .................. 10-2017-0062760

(51) Int. Cl.
*G11C 29/00* (2006.01)
*G06F 3/06* (2006.01)
(Continued)

(52) U.S. Cl.
CPC .......... *G06F 3/0659* (2013.01); *G06F 3/0611* (2013.01); *G06F 3/0619* (2013.01);
(Continued)

(58) Field of Classification Search
CPC ............... G06F 11/1048; G06F 3/0659; G06F 11/1068; G06F 3/0683; G06F 3/0619; G06F 3/0656; G06F 3/0611; G06F 3/0647; G06F 13/1689; G06F 11/1012; G06F 11/1016; G06F 11/1008; G06F 11/1004; G06F 11/076; G06F 11/108; G06F 11/0727; G06F 11/07; G06F 11/008; G06F 11/1076; G06F 11/0754; G06F 11/10; G11C 7/1057; G11C 7/1084; G11C 7/222; G11C 29/52; G11C 2029/0411; G11C 7/22; G11C 7/1012; G11C 7/106; G11C 7/1093; G11C 7/1066; G11C 5/04; G11C 29/023; G11C 11/4076;
(Continued)

(56) References Cited

U.S. PATENT DOCUMENTS

9,128,632 B2 *  9/2015  Lee ...................... G06F 3/0659
9,575,681 B1 *  2/2017  Fisher ................. G06F 16/215
(Continued)

*Primary Examiner* — Guerrier Merant
(74) *Attorney, Agent, or Firm* — IP & T Group LLP (57) ABSTRACT

A memory module includes memory devices; data buffers suitable for receiving write data transferred from a memory controller and transmitting read data to the memory controller; a buffer control signal generation circuit suitable for generating buffer control signals for controlling the data buffers, by using a command transferred from the memory controller; a command delay circuit suitable for generating an effective command by delaying the command by a delay amount of the buffer control signal generation circuit in a read operation and a write operation; a data processing circuit suitable for processing write data transferred from the data buffers and transferring processed write data to the memory devices, and processing read data transferred from the memory devices and transferring processed read data to the data buffers, in response to the effective command; and a command buffer circuit suitable for transferring the effective command to the memory devices.

18 Claims, 5 Drawing Sheets

(51) Int. Cl.
*G06F 11/10* (2006.01)
*G11C 5/04* (2006.01)
*G11C 7/10* (2006.01)
*G11C 7/22* (2006.01)
G11C 29/52 (2006.01)
G11C 29/04 (2006.01)

(52) U.S. Cl.
CPC .......... *G06F 3/0647* (2013.01); *G06F 3/0656* (2013.01); *G06F 3/0683* (2013.01); *G06F 11/1048* (2013.01); *G06F 11/1068* (2013.01); *G11C 5/04* (2013.01); *G11C 7/1057* (2013.01); *G11C 7/1084* (2013.01); *G11C 7/222* (2013.01); *G11C 29/52* (2013.01); *G11C 2029/0411* (2013.01)

(58) Field of Classification Search
CPC ... G11C 11/4096; G11C 29/028; G11C 7/109; G11C 11/1012; G11C 11/1016; G11C 11/1008; G11C 11/1004; G11C 11/076; G11C 11/108; G11C 11/0727; G11C 11/07; G11C 11/008; G11C 11/1076; G11C 11/0754; G11C 11/10
See application file for complete search history.

(56) References Cited

U.S. PATENT DOCUMENTS

| | | | |
|---|---|---|---|
| 9,640,278 B1* | 5/2017 | Xi | G11C 29/023 |
| 2006/0041730 A1 | 2/2006 | Larson | |
| 2013/0311717 A1* | 11/2013 | Kim | G06F 12/0246 |
| | | | 711/104 |
| 2014/0026013 A1* | 1/2014 | Koseki | G06F 11/1012 |
| | | | 714/764 |
| 2015/0294698 A1 | 10/2015 | Takefman et al. | |
| 2015/0310898 A1* | 10/2015 | Takefman | G11C 7/1012 |
| | | | 711/105 |
| 2016/0342545 A1* | 11/2016 | Arai | G06F 12/0868 |
| 2017/0115930 A1* | 4/2017 | Coteus | G11C 7/109 |
| 2018/0181504 A1* | 6/2018 | Morris | G06F 13/1689 |

* cited by examiner

MEMORY MODULE AND MEMORY SYSTEM INCLUDING THE SAME

CROSS-REFERENCE TO RELATED APPLICATION

This application claims priority under 35 U.S.C. § 119 to Korean Patent Application No. 10-2017-0062760 filed on May 22, 2017, which is incorporated herein by reference in its entirety.

TECHNICAL FIELD

The present disclosure relates to a semiconductor device. Particularly, the present disclosure relates to a memory module and a memory system including the same.

DISCUSSION OF THE RELATED ART

In recent years, as mobile communication terminals such as art phones and tablet PCs have become popular, and the use of social network services (SNS), machine to machine (M2M) networks, and sensor networks has increased, the amount, generation speed, and variety of data are all increasing rapidly.

In order to process big data, not only the speed of memory devices is important, but also the storage capacities of the memory devices and memory modules including them need to be very large.

SUMMARY

Various embodiments are directed to providing a technology for enabling a memory module to operate stably while increasing the capacity of the memory module.

In an embodiment, a memory module may include: a plurality of memory devices; a plurality of data buffers suitable for receiving write data transferred from a memory controller and transmitting read data to the memory controller; a buffer control signal generation circuit suitable for generating buffer control signals for controlling the plurality of data buffers, based on a command transferred from the to memory controller; a command delay circuit suitable for generating an effective command based on a delay of the command by a delay amount of the buffer control signal generation circuit in a read operation and a write operation; a data processing circuit suitable for processing write data transferred from the plurality of data buffers and transferring the processed write data to the plurality of memory devices, and suitable for processing read data transferred from the plurality of memory devices and transferring the processed read data to the plurality of data buffers, in response to the effective command; and a command buffer circuit suitable for transferring the effective command to the plurality of memory devices.

In an embodiment, a memory system may include: a memory module; and a memory controller suitable for transmitting a command, an address, and write data to the memory module, and suitable for receiving read data from the memory module, the memory module including a plurality of memory devices; a plurality of data buffers suitable for receiving the write data transferred from the memory controller and transmitting the read data to the memory controller; a buffer control signal generation circuit suitable for generating buffer control signals for controlling the plurality of data buffers, based on the command; a command delay circuit suitable for generating an effective command based on a delay of the command by a delay amount of the buffer control signal generation circuit in a read operation and a write operation; a data processing circuit suitable for processing write data transferred from the plurality of data buffers and transferring the processed write data to the plurality of memory devices, and suitable for processing read data transferred from the plurality of memory devices and transferring the processed read data to the plurality of data buffers, in response to the effective command; and a command buffer circuit suitable for transferring the effective command to the plurality of memory devices.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
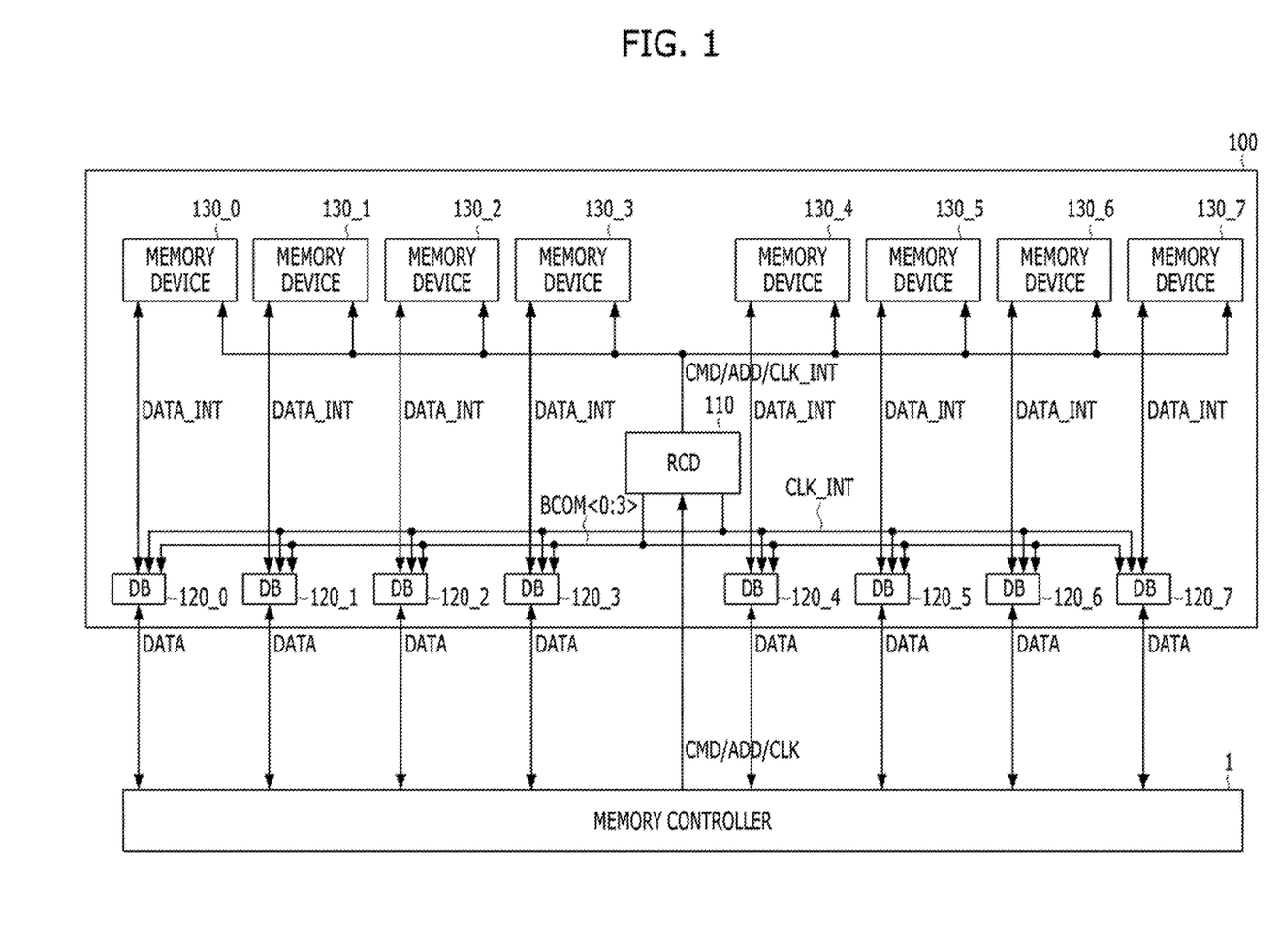
FIG. 1 is a diagram illustrating a configuration of a memory system in accordance with an embodiment.

FIG. 1 is a diagram illustrating a configuration of a memory system in accordance with an exemplary embodiment.

Referring to FIG. 1, the memory system may include a memory controller 1 of a host and a memory module 100.

The memory controller 1 of the host may transmit a command CMD, an address ADD, and a clock CLK to the memory module 100 in order to control the memory module 100, and may transmit and receive data DATA to and from the memory module 100. The memory controller 1 may be included in a processor such as a CPU (central processing unit), a GPU (graphic processing unit) and an AP (application processor) or may exist in a separate semiconductor chip outside the processor. The memory controller 1 may be employed in various systems using the memory module 100, such as a PC, a server system, and a mobile system.

The memory module 100 may include a register clock driver (RCD) 110, data buffers 120_0 to 120_7, and memory devices 130_0 to 130_7. The memory module 100 shown in FIG. 1 is referred to as an load reduced dual in-line memory module (LRDIMM).

The register clock driver 110 may buffer the command CMD, the address ADD, and the clock CLK provided from the memory controller 1, and provide them to the memory devices 130_0 to 130_7. The register dock driver 110 may also provide the clock CLK to the data buffers 120_0 to 120_7. In addition, the register clock driver 110 may process information on the command CMD and the address ADD, which is to be provided for the data buffers 120_0 to 120_7, into the appropriate form for a buffer communication bus BCOM<0:3>, and may provide the processed information to the data buffers 120_0 to 120_7 through the buffer communication bus BCOM<0:3>.

The data buffers 120_0 to 120_7 may receive data DATA from the memory controller 1 and transfer data to the memory devices 130_0 to 130_7 in a write operation, and may receive data DATA from the memory devices 130_0 to 130_7 and transfer data to the memory controller 1 in a read operation. Since the data buffers 120_0 to 120_7 in the memory module 100 directly exchange data DATA with the memory controller 1, the data buffers 120_0 to 120_7 may receive, in a write operation, data DATA from the memory controller 1 at a time when a write latency (WL) elapses from a timing at which a to write command is applied from the memory controller 1. Further, in the read operation, the data buffers 120_0 to 120_7 may transmit data DATA to the memory controller 1 at a time when a CAS latency (CL) elapses from a time at which a read command is applied from the memory controller 1. Therefore, the data buffers 120_0 to 120_7 may require information on an application time of the write command and an application time of the read command, and may be provided with the information on application times of the write, and read commands, through the buffer communication bus BCOM<0:3> from the register clock driver 110. In addition, information for setting up the data buffers 120_0 to 120_7 may be provided to the data buffers 120_0 to 120_7 through the buffer communication bus BCOM<0:3> from the register clock driver 110.

The memory devices 130_0 to 130_7 may operate based on the command CMD, the address ADD, and the clock CLK transferred from the register dock driver 110 and may also operate by transmitting and receiving data DATA through the data buffers 120_0 to 120_7. Each of the memory devices 130_0 to 130_7 may be one among various kinds of memories such as a DRAM (dynamic random access memory), an RRAM (resistive random access memory), a PRAM (phase-change random access memory), an FRAM (ferroelectric random access memory), and an MRAM (magnetic random access memory), for instance.

In the drawing, DATA_INT may denote buses through which data is transmitted between the data buffers 120_0 to 120_7 and the memory devices 130_0 to 130_7 in the memory module 100, CMD/ADD/CLK_INT may denote a bus through which a command, an address, and a dock are transmitted to the memory devices 130_0 to 130_7 from the register clock driver 110 in the memory module 100, and CLK_INT may denote a bus through which a clock is transmitted to the data buffers 120_0 to 120_7 from the register dock driver 110 in the memory module 100.

Figure 2:
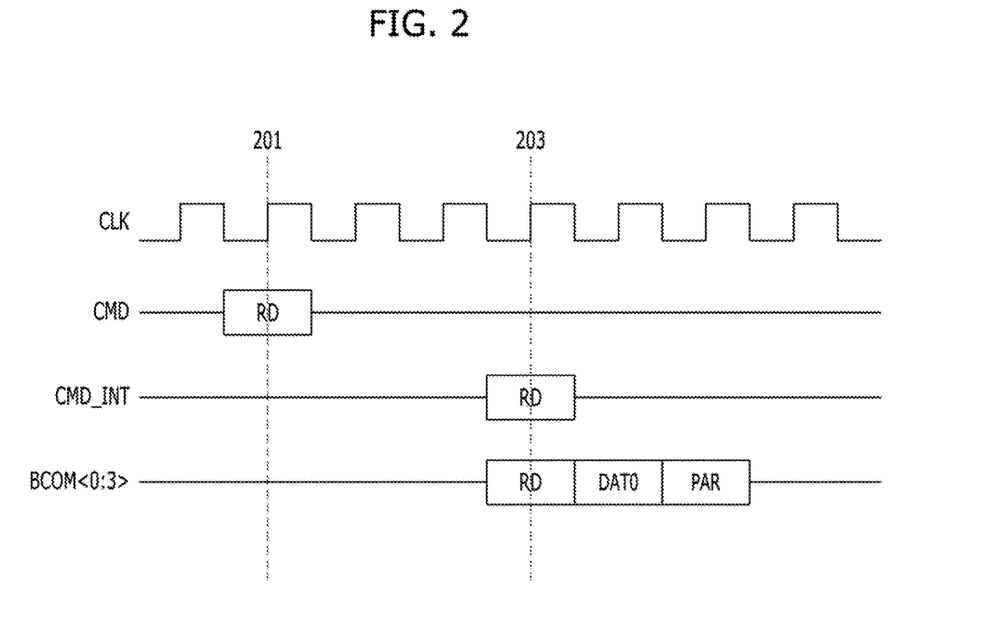
FIG. 2 is a timing diagram for a read operation in a memory module 100 in accordance with an embodiment.

FIG. 2 is a timing diagram for a read operation in which a read command is transferred to the memory devices 130_0 to 130_7 and the data buffers 120_0 to 120_7 in accordance with one exemplary embodiment.

In FIG. 2, CMD may denote a command which is transmitted to the register clock driver 110 from the memory controller 1, and CMD_INT may denote a command which is transmitted to the memory devices 130_0 to 130_7 from the register clock driver 110.

Referring to FIG. 2, at a time 201, a read command RD may be transmitted to the register dock driver 110 from the memory controller 1.

Then, at a time 203 when three clocks elapse from the time 201, the register clock driver 110 may transfer the buffered read command RD to the memory devices 130_0 to 130_7. Further, at the same time 203, the register clock driver 110 may transfer a read command changed into the form of buffer control signals to be transferred through the buffer communication bus BCOM<0:3>, to the data buffers 120_0 to 120_7. Among the buffer control signals to be transferred through the buffer communication bus BCOM<0:3>, RD may denote a buffer control signal indicating that the read command has been applied, and DATO may denote a buffer control signal indicating selected memory banks, and PAR may denote a buffer control signal instructing a parity check for the read command and data.

Referring to FIG. 2 the register clock driver 110 transfers the read command notifying that the read operation has been instructed from the memory controller 1, to the memory devices 130_0 to 130_7 and the data buffers 120_0 to 120_7 at the same time 203 according to one exemplary embodiment. In the read operation, the notice that the read command has been applied may be transferred to the memory devices 130_0 to 130_7 and the data buffers 120_0 to 120_7 at the same time according to one exemplary embodiment. One reason for this embodiment is as follows: when the read latency of the memory devices 130_0 to 130_7 and the read latency of the data buffers 120_0 to 120_7 match each other, a time at which data is outputted from the memory devices 130_0 to 130_7 and a time at which the data buffers 120_0 to 120_7 buffer the data outputted from the memory devices 130_0 to 130_7 and transfer it to the memory controller 1 would not likely mismatch each other.

Figure 3:
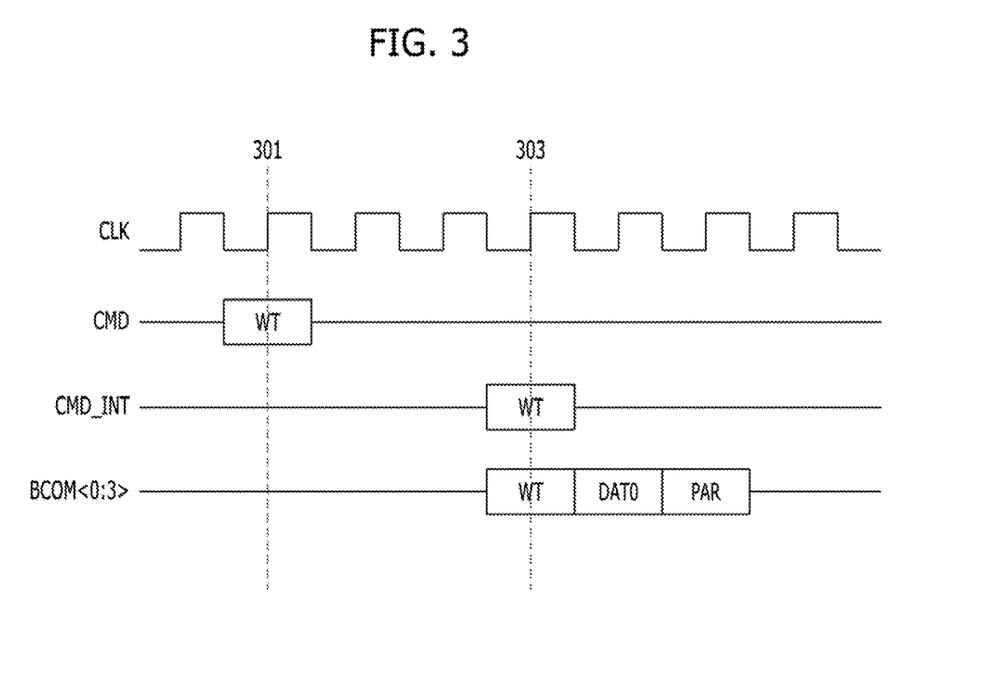
FIG. 3 is a timing diagram for a write operation in the memory module 100 in accordance with an embodiment.

FIG. 3 is a timing diagram for a write operation in which a write command is transferred to the memory devices 130_0 to 130_7 and the data buffers 120_0 to 120_7 in accordance with one exemplary embodiment.

Referring to FIG. 3, at a time 301, a write command WT may be transmitted to the register clock driver 110 from the memory controller 1.

Then, at a time 303 when three docks elapse from the time 301, the register dock driver 110 may transfer the buffered write command WT to the memory devices 130_0 to 130_7. Further, at the same time 303, the register clock driver 110 may transfer a write command changed in the form of buffer control signals to be transferred through the buffer communication bus BCOM<0:3>, to the data buffers 120_0 to 120_7. Among the buffer control signals to be transferred through the buffer communication bus BCOM<0:3>, WT may denote a buffer control signal indicating that the write command has been applied, and DAT0 may denote a buffer control signal indicating selected memory banks, and PAR may denote a buffer control signal instructing a parity check for the write command and data.

Referring to FIG. 3, the register clock driver 110 transfers the write command notifying that the write operation has been instructed from the memory controller 1, to the memory devices 130_0 to 130_7 and the data buffers 120_0 to 120_7 at the same time 303 according to one exemplary embodiment. In the write operation, similarly to the read operation, the notice that the write command has been applied is transferred to the memory devices 130_0 to 130_7 and the data buffers 120_0 to 120_7 at the same time according to one embodiment. One reason for this embodiment is as follows: when the write latency of the memory devices 130_0 to 130_7 and the write latency of the data buffers 120_0 to 120_7 match each other, a time at which the data buffers 120_0 to 120_7 buffer data transferred from the memory controller 1 and transfer the buffered data to the memory devices 130_0 to 130_7 and a time at which the memory devices 130_0 to 130_7 receive the data transferred from the data buffers 120_0 to 120_7 would not likely mismatch each other.

Figure 4:
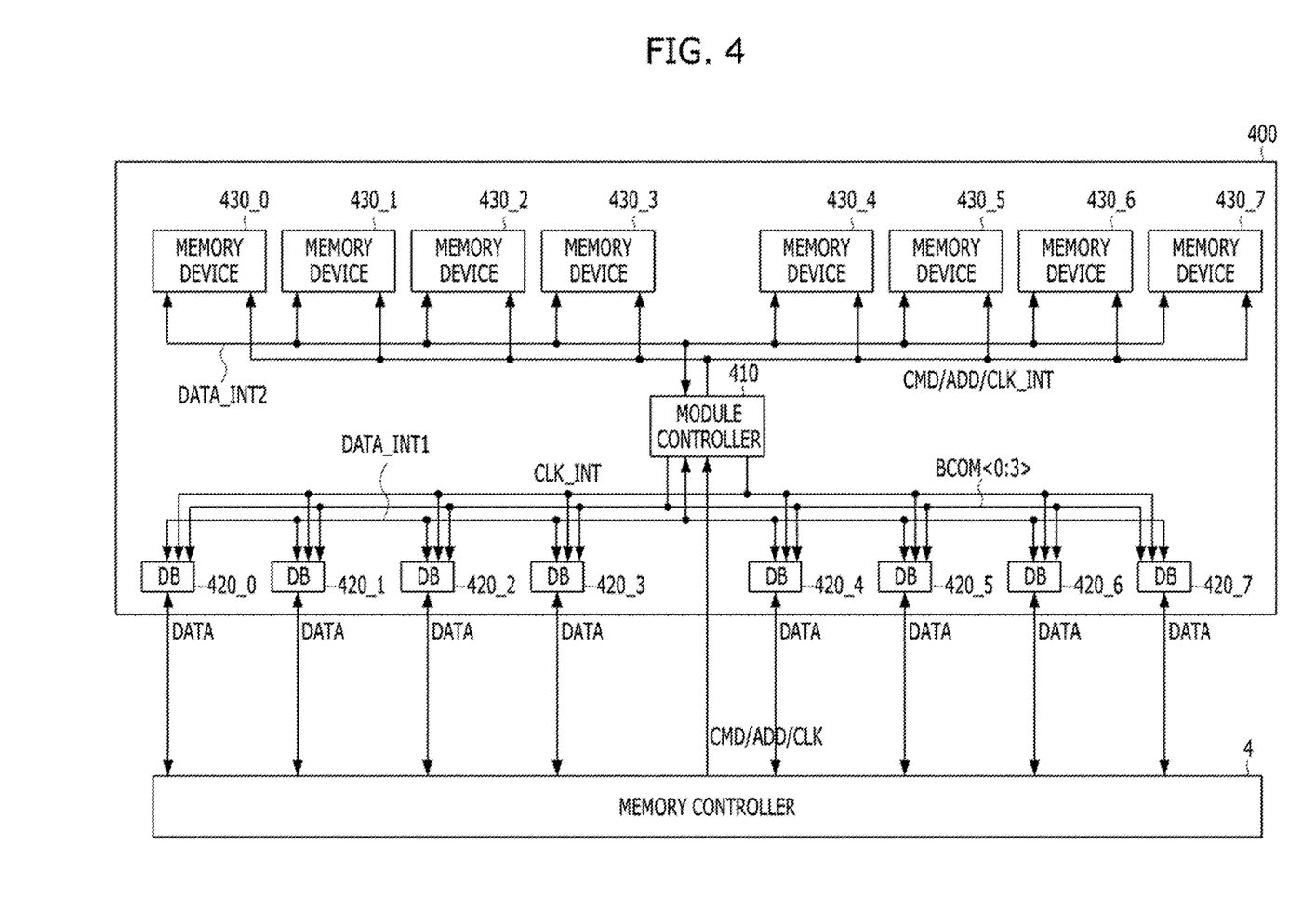
FIG. 4 is a diagram illustrating a configuration of a memory system in accordance with an embodiment.

FIG. 4 is a diagram illustrating a configuration of a memory system in accordance with one exemplary embodiment.

Referring to FIG. 4, the memory system may include a memory controller 4 of a host and a memory module 400.

The memory controller 4 of the host may transmit a command CMD, an address ADD, and a dock CL K to the memory module 400 in order to control the memory module 400, and may transmit and receive data DATA to and from the memory module 400. The memory controller 4 may be included in a processor such as a CPU (central processing unit), a GPU (graphic processing unit), and an AP (application processor) or may exist in a separate semiconductor chip outside the processor. The memory controller 4 may be employed in various systems using the memory module 400, such as a PC, a server system, and a mobile system.

The memory module 400 may include a module controller 410, data buffers 420_0 to 420_7, and memory devices 430_0 to 430_7.

Each of the memory devices 430_0 to 430_7 may have a substantially large capacity. To this end, each of the memory devices 430_0 to 430_7 may include a plurality of memory chips which are stacked according to one embodiment. For example, each of the memory devices 430_0 to 430_7 may include eight memory chips, and the entire memory devices 430_0 to 430_7 of the memory module 400 may include 64 memory chips. In the case where a plurality of memory chips are stacked to increase the capacity of the memory devices 430_0 to 430_7, since loading increases and routing of a large number of signals becomes difficult, the latencies of the memory devices 430_0 to 430_7 tend to increase, and a number of errors tend to occur during write and read operations. Each of the memory devices 430_0 to 430_7 may be one among various kinds of memories such as a DRAM (dynamic random access memory), an RRAM (resistive random access memory), a PRAM phase-change random access memory), an FRAM (ferroelectric random access memory), and an MRAM (magnetic random access memory), The module controller 410 may buffer the command CMD, the address ADD, and the clock CLK provided from the memory controller 4, and provide them to the memory devices 430_0 to 430_7. The module controller 410 may also provide the clock CLK to the data buffers 420_0 to 420_7. In addition, the module controller 410 may process information on the command CMD and the address ADD, which is to be provided for the data buffers 420_0 to 420_7, into the appropriate form for a buffer communication bus BCOM<0:3>, and may provide the processed information to the data buffers 420_0 to 420_7 through the buffer communication bus BCOM<0:3>. The above-described operations of the module controller 410 may be the same as the operations of the register clock driver 110.

Unlike the register clock driver 110, however, the module controller 410 may perform the function of transferring data DATA between the data buffers 420_0 to 420_7 and the memory devices 430_0 to 430_7. In a write operation, the module controller 410 may generate an error correction code (ECC) by using write data transferred from the data buffers 420_0 to 420_7. The module controller 410 may transmit the write data and the error correction code to the memory devices 430_0 to 430_7 such that the write data and the error correction code may be written into the memory devices 430_0 to 430_7. Moreover, in a read operation, the module controller 410 may correct error in read data from the memory devices 430_0 to 430_7 by using an error correction code read from the memory devices 430_0 to 430_7, and may transmit error-corrected read data to the data buffers 420_0 to 420_7. Therefore, data may be transmitted through an internal data bus DATA_INT1 between the data buffers 420_0 to 420_7 and the module controller to 410, and data and an error correction code may be transmitted through an internal data bus DATA_INT2 between the module controller 410 and the memory devices 430_0 to 430_7. By the error correction code generating operation and the error correcting operation of the module controller 410, it is possible to correct errors that tend to increase due to the expanded capacities and stacked memory chips in the memory devices 430_0 to 430_7.

In addition, in order to increase the data capacities of the memory devices 430_0 to 430_7 the module controller 410 may perform operations of compressing and decompressing data. For example, by compressing data and transferring compressed data to the memory devices 430_0 to 430_7 in a write operation and by decompressing data read from the memory devices 430_0 to 430_7 and transferring decompressed data to the data buffers 420_0 to 420_7 in a read operation, it is possible to store an increased amount of data in the memory devices 430_0 to 430_7.

Unlike the memory system of FIG. 2, in the memory system of FIG. 4, the module controller 410 and the data buffers 420_0 to 420_7 may directly transmit and receive data in read and write operations. Thus, the data transmission and receiving timings of the module controller 410 may need to match the data transmission and receiving timings of the data buffers 420_0 to 420_7 according to one embodiment.

Figure 5:
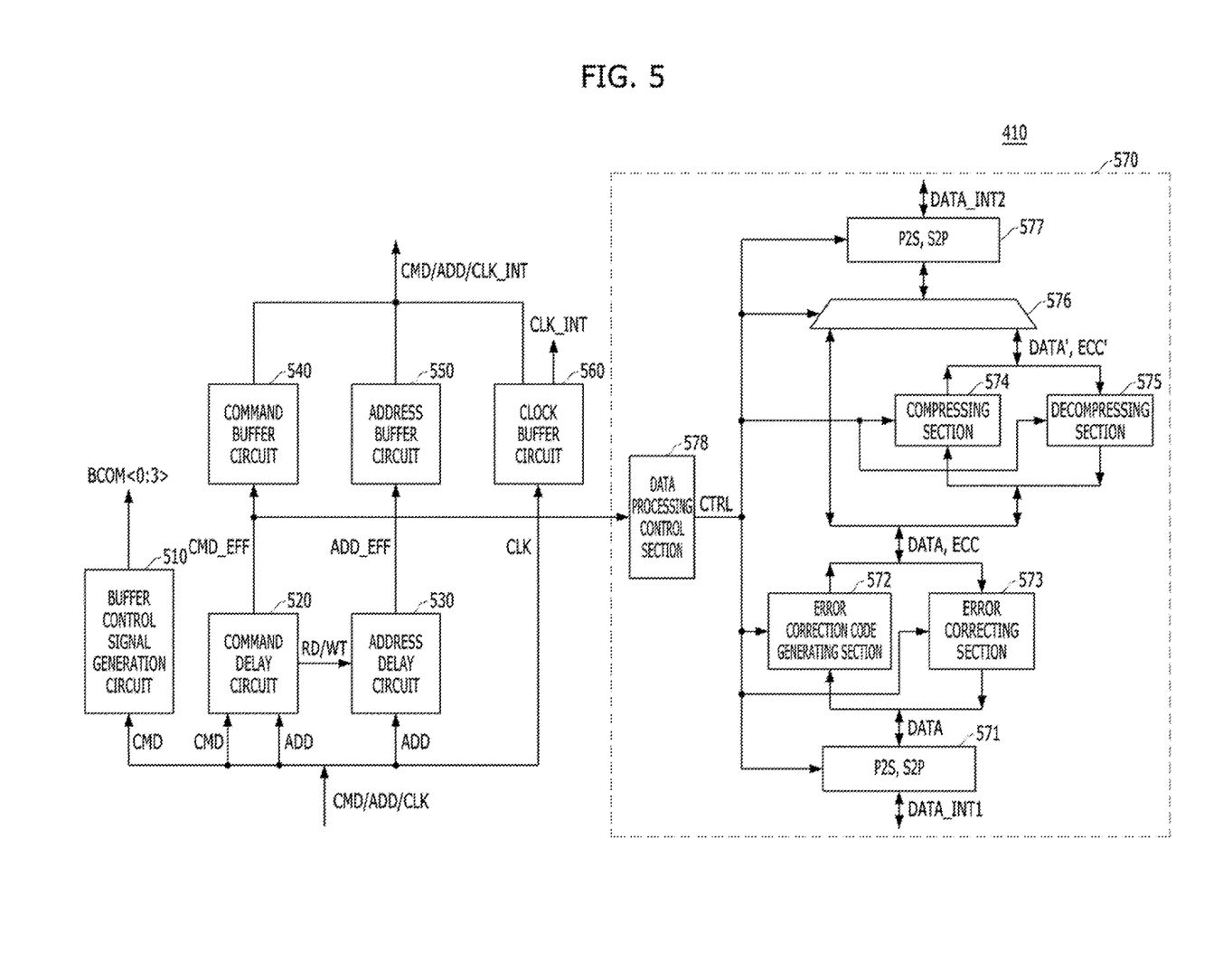
FIG. 5 is a diagram illustrating a configuration of the module controller 410 shown in FIG. 4.

FIG. 5 is a diagram illustrating a configuration of the module controller 410 shown in FIG. 4 in accordance with one exemplary embodiment.

Referring to FIG. 5, the module controller 410 may include a buffer control signal generation circuit 510, a command delay circuit 520, an address delay circuit 530, a command buffer circuit 540, an address buffer circuit 550, a clock buffer circuit 560, and a data processing circuit 570.

The buffer control signal generation circuit 510 may generate buffer control signals for controlling the data buffers 420_0 to 420_7, that is, signals to be loaded on the buffer communication bus BCOM<0:3>, by using the command CMD and the address ADD. The buffer control signal generation circuit 510 may convert information that is necessary for the operations of the data buffers 420_0 to 420_7 from the information transferred in the command CMD and the address ADD, into buffer control signals which conform to the protocol of the buffer communication bus BCOM<0:3>. The buffer control signal generation circuit 510 may be inputted with the entire bits of the address ADD or may be inputted with partial bits of the address ADD.

The command delay circuit 520 may generate an effective command CMD_EFF by delaying the command CMD by the delay amount of the buffer control signal generation circuit 510 in read and write operations. For example, if a delay of three clocks occurs for the buffer control signal generation circuit 510 to generate the buffer control signals by using the command CMD and the address ADD, the command delay circuit 520 may generate the effective command CMD_EFF by delaying the command CMD by three clocks in the same manner. With respect to other commands than a read operation and a write operation, however, the command delay circuit 520 may not delay the command CMD and may simply generate the effective command CMD_EFF as the command CMD is e.g., without any delay). In other words, as for other commands than a read operation and a write operation, the delay value of the command delay circuit 520 may be set to 0. The command delay circuit 520 may distinguish a read operation and a write operation from the other operations based on the received command CMD.

The address delay circuit 530 may generate an effective address ADD_EFF by delaying the address ADD by the delay amount of the buffer control signal generation circuit 510 in read and write operations. With respect to commands other than a read operation and a write operation however, the, address delay circuit 530 may not delay the address ADD and may simply generate the effective address ADD_EFF as the address ADD is. In other words, the address delay circuit 530 may generate the effective address ADD_EFF by delaying or not delaying the address ADD in the same manner as the command delay circuit 520 may or may not delay the command CMD. A read/write signal RD/WT is a signal for the command delay circuit 520 to notify the address delay circuit 530 of a read operation and a write operation. Namely, the read/write signal RD/WT is a signal that is activated in a read operation and a write operation.

The command buffer circuit 540 may buffer the effective command CMD_EFF and transfer the buffered command to the memory devices 430_0 to 430_7. The address buffer circuit 550 may buffer the effective address ADD_EFF and transfer the buffered address to the memory devices 430_0 to 430_7. The clock buffer circuit 560 may buffer the dock CLK transferred from the memory controller 4 and transfer the buffered dock to the memory devices 430_0 to 430_7 and the data buffers 420_0 to 420_7. The command buffered by the command buffer circuit 540, the address buffered by the address buffer circuit 550, and the clock buffered by the clock buffer circuit 560 may be transferred to the memory devices 430_0 to 430_7 through a bus CMD/ADD/CLK_INT. Also, the clock buffered by the clock buffer circuit 560 may be transferred to the data buffers 420_0 to 420_7 through a bus CLK_INT.

The data processing circuit 570 may include a first. serial-to-parallel and parallel-to-serial converting section 571, an error correction code generating section 572, an error correcting section 573, a compressing section 574, a decompressing section 575, a selecting section 576, a second serial-to-parallel and parallel-to-serial converting section 577, and a data processing control section 578.

The first serial-to-parallel and parallel-to-serial converting section 571 may serial-to-parallel convert data DATA transferred from the data buffers 420_0 to 420_7 and transfer the converted data to the error correction code generating section 572 in a write operation, and may parallel-to-serial convert data DATA transferred from the error correcting section 573 and transfer the converted data to the data buffers 420_0 to 420_7 in a read operation. This is to enable the error correction code generating section 572 and the error correcting section 573 to process data in parallel and thereby shorten the time required for generating an error correction code ECC and correcting error.

The error correction code generation circuit 572 may generate the error correction code ECC by using data DATA transferred from the first serial-to-parallel and parallel-to-serial converting section 571, in the write operation. The error correcting section 573 may correct any error in data DATA by using the error correction code ECC transferred from the second serial-to-parallel and parallel-to-serial converting section 577 or the decompressing section 575, in the read operation.

The compressing section 574 may compress the data DATA and the error correction code ECC and thereby decrease the numbers of bits thereof in the write operation, In the drawing, data DATA' and an error correction code ECC' designate compressed counterparts of the data DATA and the error correction code ECC, respectively. The decompressing section 575 may decompress the data DATA' and the error correction code ECC' in the read operation.

The selecting section 576 is a component for selecting whether to use the compressing section 574 and the decompressing section 575. In an embodiment where a compressing function is not used, the selecting section 576 may electrically couple the error correction code generating section 572 and the error correcting section 573 with the second serial-to-parallel and parallel-to-serial converting section 577. In other words, the compressing section 574 and the decompressing section 575 may be bypassed. In an embodiment where a compressing function is used, the selecting section 576 may electrically couple the compressing section 574 and the decompressing section 575 with the second serial-to-parallel and parallel-to-serial converting section 577.

The second serial-to-parallel and parallel-to-serial converting section 577 may parallel-to-serial convert data and an error correction code in the write operation, and may serial-to-parallel convert data and an error correction code in the read operation. In other words, the second serial-to-parallel and parallel-to-serial converting section 577 may perform opposite operations to the first serial-to-parallel and parallel-to-serial converting section 571.

The data processing control section 578 may control the operations and the operation timings of the components 571 to 577 in the data processing circuit 570 in response to the effective command CMD_EFF. In the drawing, the symbol CTRL between the data processing control section 578 and the components 571 to 577 indicates that the data processing control section 578 controls the components 571 to 577. Since the timing control operation of the data processing control section 578 is not implemented in response to the command CMD but is implemented in response to the effective command CMD_EFF, the data processing timing of the data processing control section 578 and the data processing timing of the data buffers 420_0 to 420_7 may match each other. These two data processing timings would unlikely mismatch each other because the data buffers 420_0 to 420_7 operate in response to control signals on the buffer communication bus BCOM<0:3>, which have the same timing information as the effective command CMD_EFF.

While it is illustrated in FIG. 5 that the module controller 410 includes the buffer control signal generation circuit 510, the command delay circuit 520, the address delay circuit 530, the command buffer circuit 540 the address buffer circuit 550, the clock buffer circuit 560, and the data processing circuit 570, it is to be noted that some components among them may be omitted depending on its design. For example, in the case where an error correcting operation is not needed, the error correction code generating section 573 and the error correcting section 574 may be omitted in the data processing circuit 570. Also, in the case where a data compressing operation is not needed, the compressing section 574, the decompressing section 575, and the selecting section 576 may be omitted in the data processing circuit 570.

Further, while it is illustrated in FIG. 5 that the buffer control signal generation circuit 510, the command delay circuit 520, the address delay circuit 530, the command buffer circuit 540, the address buffer circuit 550, the clock buffer circuit 560, and the data processing circuit 570 are included in the module controller 410, it is to be noted that some components among them may be provided outside the module controller 410. In addition each function block shown in FIG. 5 (e.g., the delay circuits and sections) may include suitable circuit elements adapted to perform the functions as described. For instance, the command delay circuit 520 may include a hardware circuit adapted to delay the received command CMD and output the delayed command CMD_EFF.

Figure 6:
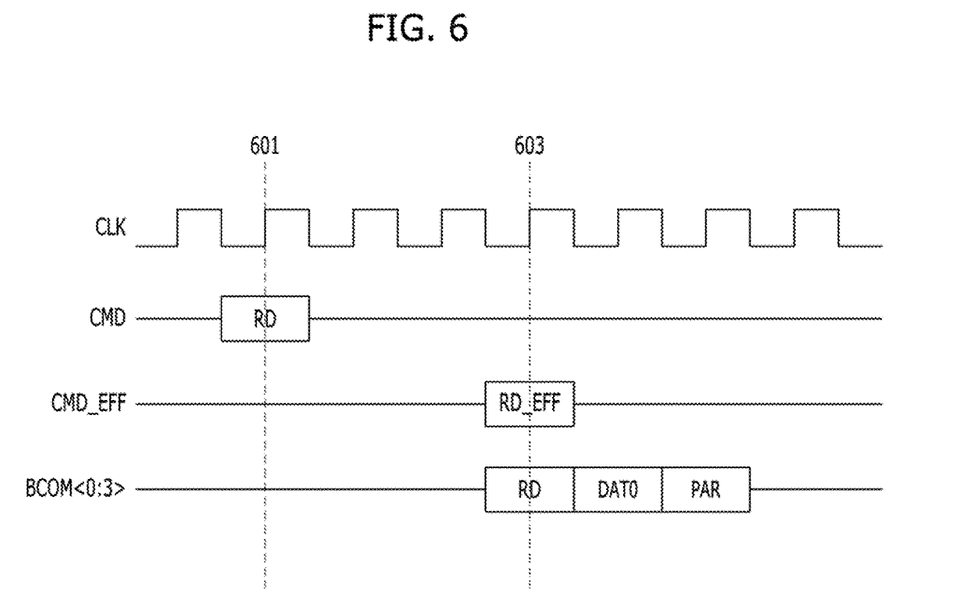
FIG. 6 is a timing diagram for a read operation in a memory module 400 in accordance with an embodiment.

FIG. 6 is a timing diagram for a read operation in which a read command is transferred to the data processing circuit 570 and the data buffers 420_0 to 420_7 in the memory module 400.

Referring to FIG. 6, at a time 601, a read command RD may be transmitted to the memory module 400 from the memory controller 4.

Then, at a time 603 when three docks elapse from the timing 601, the buffer control signals generated by the buffer control signal generation circuit 510, that is, buffer control signals notifying the application of the read command RD, may be transferred to the data buffers 420_0 to 420_7 through the buffer communication bus BCOM<0:3>.

Also, at the same time 603, an effective read command RD_EFF generated by the command delay circuit 520 may be transferred to the data processing circuit 570.

Since the notice that the read command RD has been applied is transferred to the data buffers 420_0 to 420_7 and the data processing circuit 570 at the same time, the data buffers 420_0 to 420_7 and the data processing circuit 570 may transmit and receive data without experiencing a mismatch in timing.

Figure 7:
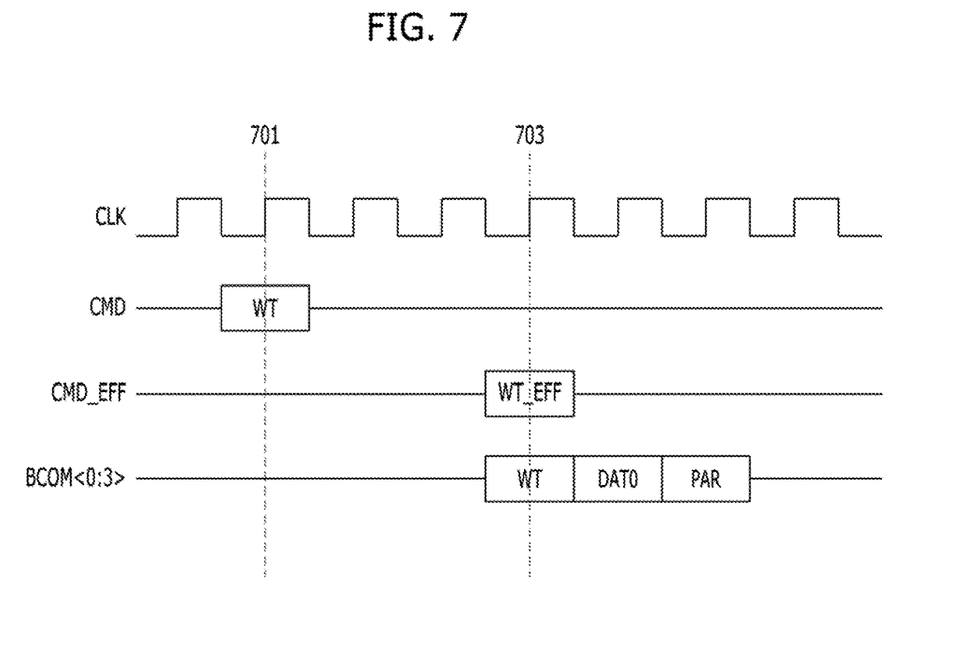
FIG. 7 is a timing diagram for a write operation in the memory module 400 in accordance with an embodiment.

FIG. 7 is a timing diagram for a write operation in which a write command is transferred to the data processing circuit 570 and the data buffers 420_0 to 420_7 in the memory module 400.

Referring to FIG. 7, at a time 701, a write command WT may be transmitted to the memory module 400 from the memory controller 4.

Then, at a time 701 when three clocks elapse from the timing 703, the buffer control signals generated by the buffer control signal generation circuit 510, that buffer control signals notifying the application of the write command WT, may be transferred to the data buffers 420_0 to 420_7 through the buffer communication bus BCOM<0:3>.

Also, at the same time 703, an effective write command WT_EFF generated by the command delay circuit 520 may be transferred to the data processing circuit 570.

Since the notice that the write command WT has been applied is transferred to the data buffers 420_0 to 420_7 and the data processing circuit 570 at the same time, the data buffers 420_0 to 420_7 and the data processing circuit 570 may transmit and receive data without experiencing a mismatch in timing.

According to various embodiments, it is possible to enable a memory module to operate stably while increasing the capacity of the memory module.

Although various embodiments have been described for illustrative purposes, it will be apparent to those skilled in the art that various changes and modifications may be made without departing from the spirit and scope of the invention as defined in the following claims.

What is claimed is:

1. A memory module comprising:
 a plurality of memory devices;
 a plurality of data buffers suitable for receiving write data transferred from a memory controller and transmitting read data to the memory controller; and
 a module controller comprising:
  a buffer control signal generation circuit suitable for generating buffer control signals for controlling the plurality of data buffers, based on a command transferred from the memory controller;
  a command delay circuit suitable for generating an effective command based on a delay of the command by a delay amount of the buffer control signal generation circuit in a read operation and a write operation;
  a data processing circuit suitable for processing write data transferred from the plurality of data buffers and transferring the processed write data to the plurality of memory devices, and processing read data transferred from the plurality of memory devices and transferring the processed read data to the plurality of data buffers, in response to the effective command; and
  a command buffer circuit suitable for transferring the effective command to the plurality of memory devices.

2. The memory module according to claim 1, wherein the command delay circuit is suitable for generating the effective command as the command is without delaying the command, in an operation other than the read operation and the write operation.

3. The memory module according to claim 2, wherein the module controller further comprises:
 an address delay circuit suitable for generating an effective address based on a delay of an address transferred from the memory controller by the delay amount of the buffer control signal generation circuit in the read operation and the write operation; and
 an address buffer circuit suitable for transferring the effective address to the plurality of memory devices.

4. The memory module according to claim 3, wherein the address delay circuit is suitable for generating-the effective address as the address is without delaying the address, in an operation other than the read operation and the write operation.

5. The memory module according to claim 4, wherein the module controller further comprises:
 a clock buffer circuit suitable for transferring a clock transferred from the memory controller to the plurality of memory devices.

6. The memory module according to claim 1, wherein the data processing circuit comprises:
 an error correction code generating section suitable for generating, based on the write data transferred from the plurality of data buffers, an error correction code to be stored together with the write data in the plurality of memory devices, in the write operation; and
 an error correcting section suitable for correcting an error in the read data read from the plurality of memory devices, based on an error correction code read from the plurality of memory devices, in the read operation.

7. The memory module according to claim 6, wherein the data processing circuit further comprises:
 a compressing section suitable for compressing the write data and the error correction code to be stored in the plurality of memory devices, in the write operation; and a decompressing section suitable for decompressing the read data and the error correction code read from the plurality of memory devices, in the read operation.

8. The memory module according to claim 6, wherein the data processing circuit further comprises:
a data processing control section suitable for controlling operations of the error correction code generating section and the error correcting section in response to the effective command.

9. The memory module according to claim 1,
wherein each of the plurality of memory devices is a dynamic random access memory (DRAM), and
wherein the memory module is a dual in-line memory module (DIMM) type.

10. A memory system comprising:
a memory module; and
a memory controller suitable for transmitting a command, an address, and write data to the memory module, and receiving read data from the memory module,
the memory module comprising:
a plurality of memory devices;
a plurality of data buffers suitable for receiving the write data transferred from the memory controller and transmitting the read data to the memory controller; and
a module controller comprising:
a buffer control signal generation circuit suitable for generating buffer control
signals for controlling the plurality of data buffers, based on the command;
a command delay circuit suitable for generating an effective command based on a delay of the command by a delay amount of the buffer control signal generation circuit in a read operation and a write operation;
a data processing circuit suitable for processing write data transferred from the plurality of data buffers and transferring the processed write data to the plurality of memory devices, and processing read data transferred from the plurality of memory devices and transferring the processed read data to the plurality of data buffers, in response to the effective command; and
a command buffer circuit suitable for transferring the effective command to the plurality of memory devices.

11. The memory system according to claim 10, wherein the command delay circuit is suitable for generating the effective command as the command is without delaying the command, in an operation other than the read operation and the write operation.

12. The memory system according to claim 11, wherein the module controller further comprises:
an address delay circuit suitable for generating an effective address based on a delay of an address transferred from the memory controller by the delay amount of the buffer control signal generation circuit in the read operation and the write operation; and
an address buffer circuit suitable for transferring the effective address to the plurality of memory devices.

13. The memory system according to claim 12, wherein the address delay circuit is suitable for generating the effective address as the address is without delaying the address, in an operation other than the read operation and the write operation.

14. The memory system according to claim 13, wherein the module controller further comprises:
a clock buffer circuit suitable for transferring a clock transferred from the memory controller to the plurality of memory devices.

15. The memory system according to claim 10, wherein the data processing circuit comprises:
an error correction code generating section suitable for generating, based on the write data transferred from the plurality of data buffers, an error correction code to be stored together with the write data in the plurality of memory devices, in the write operation; and
an error correcting section suitable for correcting an error in the read data read from the plurality of memory devices, based on an error correction code read from the plurality of memory devices, in the read operation.

16. The memory system according to claim 15, wherein the data processing circuit further comprises:
a compressing section suitable for compressing the write data and the error correction code to be stored in the plurality of memory devices, in the write operation; and
a decompressing section suitable for decompressing the read data and the error correction code read from the plurality of memory devices, in the read operation.

17. The memory system according to claim 16, wherein the data processing circuit further comprises:
a data processing control section suitable for controlling operations of the error correction code generating section and the error correcting section in response to the effective command.

18. The memory system according to claim 10,
wherein each of the plurality of memory devices is a dynamic random access memory (DRAM), and
wherein the memory module is a dual in-line memory module (DIMM) type.

* * * * *